US009105800B2

(12) United States Patent
Gooch et al.

(10) Patent No.: US 9,105,800 B2
(45) Date of Patent: Aug. 11, 2015

(54) METHOD OF FORMING DEPOSITED PATTERNS ON A SURFACE

(71) Applicant: Raytheon Company, Waltham, MA (US)

(72) Inventors: Roland Gooch, Dallas, TX (US); Thomas Allan Kocian, Dallas, TX (US); Buu Diep, Murphy, TX (US); Adam M. Kennedy, Santa Barbara, CA (US); Stephen H. Black, Buellton, CA (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 14/100,048

(22) Filed: Dec. 9, 2013

(65) Prior Publication Data

US 2015/0162479 A1  Jun. 11, 2015

(51) Int. Cl.
*H01L 31/18* (2006.01)
*H01L 31/0232* (2014.01)

(52) U.S. Cl.
CPC .......... *H01L 31/18* (2013.01); *H01L 31/02327* (2013.01)

(58) Field of Classification Search
USPC ............ 438/72, 114, 465, 471, 476, 496, 584
See application file for complete search history.

(56) References Cited

U.S. PATENT DOCUMENTS

| 6,252,229 | B1 | 6/2001 | Hays et al. |
| 7,381,583 | B1 | 6/2008 | Ebel et al. |
| 2006/0154066 | A1* | 7/2006 | Kita et al. ...................... 428/401 |
| 2011/0014732 | A1* | 1/2011 | Lee .................................. 438/27 |
| 2012/0010698 | A1* | 1/2012 | Hwang et al. ................ 623/1.42 |

FOREIGN PATENT DOCUMENTS

| EP | 2 484 629 A1 | 8/2012 |
| FR | 2 846 906 | 11/2002 |
| JP | 2009130110 | 6/2009 |

OTHER PUBLICATIONS

Martin Bring, Infrared Imaging Components for Use is Automotive Safety Applications, ICU Project Deliverable, Jul. 9, 2011, pp. 1-24.
Frank Niklaus, Christian Vieder, Henrik Jakobsen, MEMS-Based Uncooled Infrared Bolometer Arrays—A Review, MEMS/MOEMS Technologies and Applications III, 2007, pp. 1-15.

(Continued)

*Primary Examiner* — Mamadou Diallo
(74) *Attorney, Agent, or Firm* — Daly, Crowley, Mofford & Durkee, LLP

(57) ABSTRACT

A method for forming a coating of material on selected portions of a surface of a substrate having a plurality of cavities, each cavity having outer, peripheral sidewalls extending outwardly from the surface. The method includes: providing a structure having a release agent thereon; contacting top surface of the wafer with the release agent to transfer portions of the release agent to the top surface of the wafer while bottom portions of the cavities remain spaced from the release agent to produce an intermediate structure; the release agent disposed on the top surface of the wafer and with the bottom portions of the cavities void of the release agent; exposing the intermediate structure to the material to blanket coat the material on both the release agent and the bottom portions of the cavities; and selectively removing the release agent together with the coating material while leaving the coating material on the bottom portions of the cavities.

3 Claims, 2 Drawing Sheets

(56) References Cited

OTHER PUBLICATIONS

Notification of Transmittal of the International Search Report and the Written Opinion of the International Searching Authority, or the Declaration, PCT/US2014/067285, Mar. 3, 2015, 1 page.

International Search Report, PCT/US2014/067285, Mar. 3, 2015, 5 pages.

Written Opinion of the International Searching Authority, PCT/US2014/067285, Mar. 3, 2015, 6 pages.

* cited by examiner

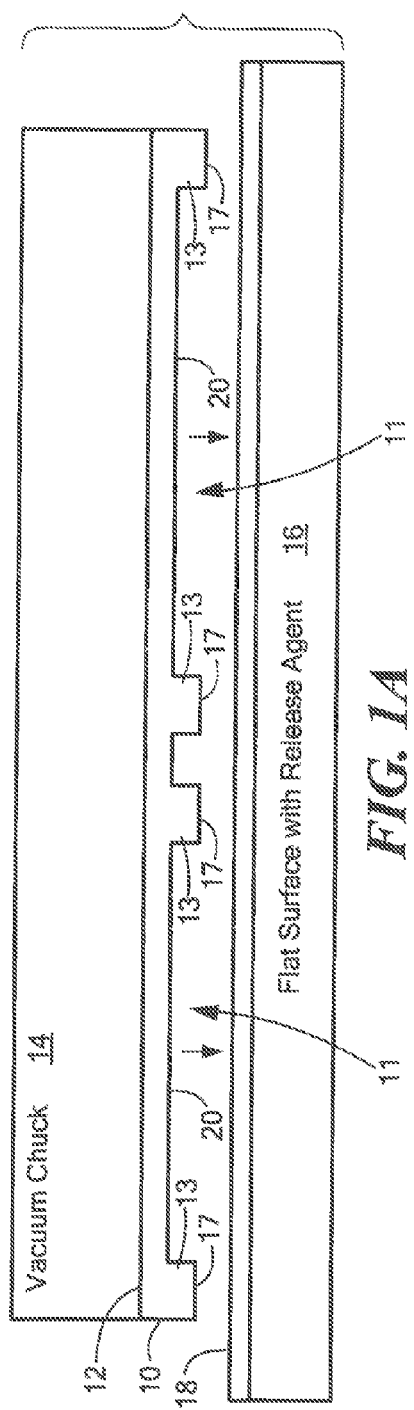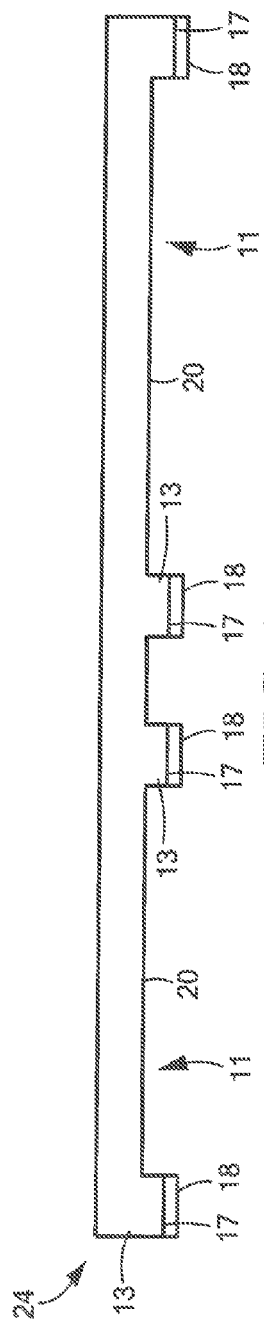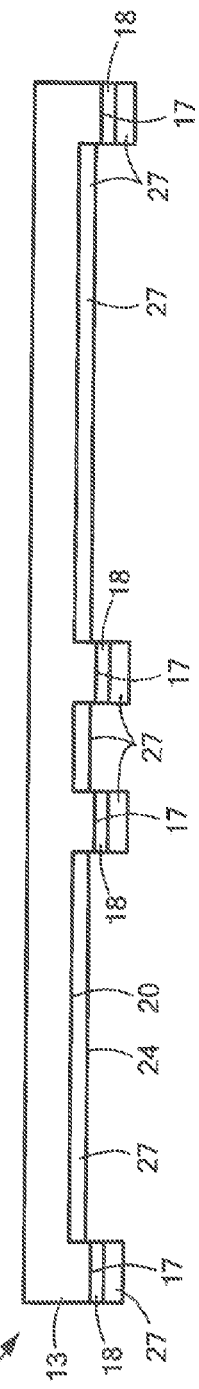

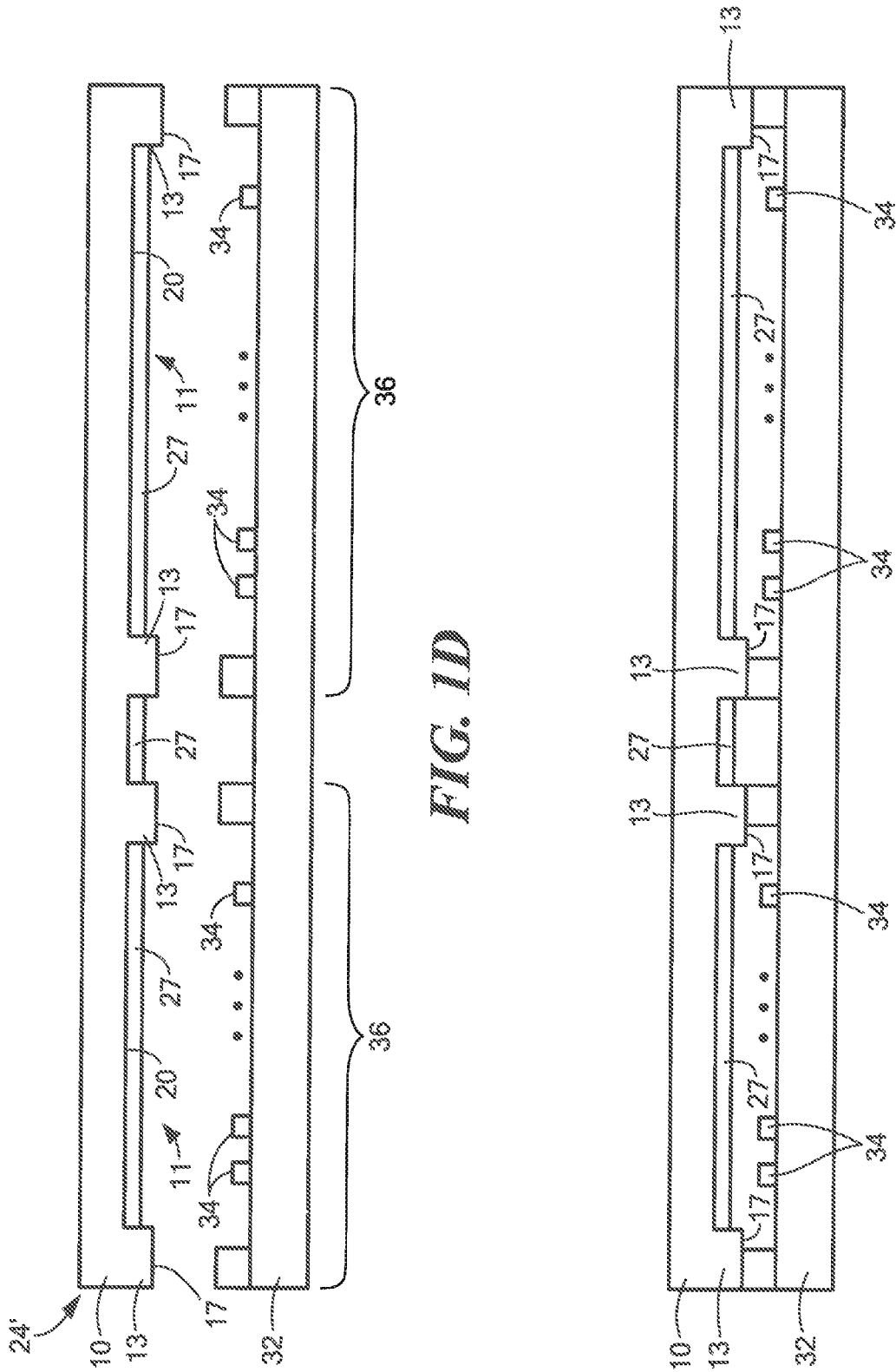

METHOD OF FORMING DEPOSITED PATTERNS ON A SURFACE

TECHNICAL FIELD

This disclosure relates generally to methods for forming deposited patterns on a surface and more particularly, the methods for forming anti-reflection coatings on selected areas of an optical window wafer used in wafer level packaging of optical elements.

BACKGROUND

As is known in the art, it is frequently required to forming anti-reflection coatings on selected areas of an optical window wafer used in wafer level packaging of optical elements. In one application, for example, wafer level packaging of Infrared (IR) bolometers, an optical window wafer (sometimes referred to as a cap wafer) has a plurality of cavities or recesses formed in a surface thereof, each recess being formed to provide a cavity (with vertically extending walls) associated with (spaced from and disposed over) a corresponding one of a plurality of IR detector (e.g., bolometers) arrays formed in a second, underlying wafer bonded to the cap wafer. In addition to the recesses, the cap wafer also includes a patterned anti-reflective coating (ARC), thin film getters, if required, and bond structures.

As is also known in the art, coating a window cap wafer with an anti-reflection coating for wafer level packaged IR bolometer detectors is currently done by coating the optical window through a shadow mask or by coating the whole surface (top surface and cavity surface) and polishing off the upper surface. A photolithographic resist lift-off method may also be used, but expensive capital equipment is required. The shadow mask adds the cost of the mask (often only good for a single use) and alignment tooling. Polishing requires precision polishing equipment and skilled operators. Both require clearing to a higher level than is typical in the optics industry. Thus, patterning an anti-reflective coating on a surface can be difficult with traditional methods, which are 1. Shadow mask (limited by alignment tolerance, edge sharpness). 2. Photolithographic lift-off (ARCs are typically too thick for easy photoresist lift-off, and require capital equipment. Lift-off is an undesirable messy process in the semiconductor industry). 3. If over topology where recessed surface is to be coated and upper surface to be removed, polish off of upper surface may be used (requires precision optical polishing equipment). All of these have problematic issues when applied to the semiconductor world, particularly with cleanliness and particle control.

The basic wafer level packaging process may be summarized as: Etch cavities in cap wafer; Deposit an ARC on the bottom of the cavity, Metalize a seal ring pattern on the top surface of the cap wafer surrounding the cavity; Deposit getter material on another portion of the top surface, if required; Apply solder to seal ring area; and to IR detector device wafer; and Saw into individual detector arrays.

SUMMARY

In accordance with the present disclosure, a method is provided for forming a coating of material on selected portions of a substrate having a plurality of cavities formed in selected portions of a surface of the substrate, each cavity having outer, peripheral sidewalls extending outwardly from a floor of the cavity. The method includes: providing a structure having a release agent thereon; contacting top surfaces of the sidewalls with the portions of the contacted release agent being transferred to the top surfaces of the substrate while bottom portions of the cavities remain spaced from the release agent to produce an intermediate structure surface comprising: the release agent disposed on the top surfaces of the substrate and with the bottom portions of the cavities void of the release agent; exposing the surface of the intermediate structure to the material to blanket coat the material on both the release agent disposed on the top surface of the substrate and the bottom portions of the cavities; and exposing the intermediate structure having the coated release agent and the bottom portions to a process to selectively remove the release agent together with the coating material thereon from the top surface of the substrate while leaving the coating material on the bottom portions of the cavities.

In one embodiment, a method is provided for forming an anti-reflection coating on selected portions of an optical energy transparent wafer having a plurality of cavities formed in selected portions of a surface of the wafer, each cavity having outer, peripheral sidewalls extending outwardly from the floor of the cavity. The method includes: providing a structure having a release agent thereon; contacting top surface of the wafer with a portion of the release agent to transfer the release agent to the top surfaces of the wafer while bottom portions of the cavities remain spaced from the release agent to produce an intermediate structure surface comprising: the release agent disposed on the top surface of the wafer and with the bottom portions of the cavities void of the release agent; exposing the surface of the intermediate structure to an anti-reflection coating material to blanket coat the anti-reflection material on both the release agent disposed on the top surface and the bottom portions of the cavities; and exposing the intermediate structure having both the release agent disposed on the top surface of the wafer and the bottom portions of the cavities void of the release agent to a process to selectively remove the release agent together with the anti-reflection coating material thereon while leaving the anti-reflection coating material on the bottom portions of the cavities.

In one embodiment, the method includes: providing a second wafer having a plurality of arrays for detectors, each one of the arrays being associated with a corresponding one of the cavities; aligning each one of the array with the corresponding one of the cavities; and bonding the optically transparent wafer to the second wafer, with each one on the cavities having the anti-refection coating thereon displaced from the corresponding array and a second portion of the top surface being bonded to the second wafer.

With such method, a thin water or solvent soluble layer (the release agent) is applied only to the exposed surface by controlled contact transfer prior to depositing an AR film or coating. The ARC film portions of the release layer are then easily removed when the release layer is removed in water or solvent in an ultrasonic cleaner. If the release agent is only a monolayer or so thick, the ARC adhesion is weakened by this layer, and is easily removed in an ultrasonic cleaner. The method removes the need for a shadow mask, polishing equipment, and capital equipment for these and any traditional alternative, such as a photoresist sprayer, UV exposure and development, and liftoff equipment. The equipment savings for high volume production could be several million dollars.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 1A-1B are simplified cross sectional diagrams of a process for forming an anti-reflection coating on selected portions of an optical energy transparent wafer according to the disclosure.

Like reference symbols in the various drawings indicate like elements.

DETAILED DESCRIPTION

Referring now to FIG. 1A, a portion of an optically transparent window wafer 10 (a cap wafer), here for example, silicon, is shown. The inside surface of the wafer 10 is formed with a plurality of cavities 11 formed in selected portions of the inside surface, each cavity 11 having outer, peripheral sidewalls 13 extending outwardly from the inner surface, as indicated. The sidewalls 13 have top surfaces 17, as indicated. The outside surface 12 of the wafer 10 is temporarily attached to a vacuum chuck 14. A second structure 16, with a very flat surface, here for example a polished granite surface plate, or another silicon wafer, is coated with a release agent 18, as shown. Here, for example, the release agent 18 is polyvinyl alcohol, or other suitable material, having a thickness of one molecular layer to many layers, up to a fraction of a millimeter thick. The top surface 17 of the wafer is contacted momentarily with a portion of the release agent 18 to transfer portions of the release agent 18 to the top surface 17 of the wafer while bottom portions 20 of the cavities 11 remain spaced from the release agent 18 to produce an intermediate structure 24 (FIG. 1B) having a surface comprising: the release agent 18 disposed on the top surface 17 of the wafer and with the bottom portions 20 of the cavities 11 void of the release agent 18.

Referring now to FIG. 1C, the intermediate structure 24 is exposed to an anti-reflection coating material 27 to blanket coat the anti-reflection material 27 on both the release agent 18 disposed on the top surface 17 of the wafer and the bottom portions 20 of the cavities 11 to produce the structure 24', as shown in FIG. 1C.

Referring now to FIG. 1D, the structure 24' (FIG. 1C) having both the release agent 18 disposed on the top surface 17 of the wafer and the bottom portions 20 of the cavities 11 void of the release agent 18 to a process, here for example, immersion in water (or a solvent, for example if the release agent is a photoresist layer) to selectively remove the release agent 18 together with the anti-reflection coating material 27 thereon while leaving the anti-reflection coating material 27 on the bottom portions 20 of the cavities 11, as shown in the upper portion of FIG. 1D.

Here the wafer 10 is wafer bonded to a second wafer 32 (shown in the bottom portion of FIG. 1D) having plurality of bolometers 34 connected to readout circuitry in wafer 32 that comprise wafer level package (WLP) detector devices 36, each one of detector devices 36 is being associated with a corresponding one of the cavities 11. Each one of the detector devices 36 is aligned with the corresponding one of the cavities 11. Thus, as shown in FIG. 1E, the optically transparent wafer 10 is bonded to the second wafer 32, with each one on the cavities 11 having the anti-reflection coating 24 on the bottom portion of the cavities 11 displaced from the corresponding array 34 and a second portion of the distal ends 17 of the walls (top surface) being bonded to the second wafer 32. The bonded wafer pair (wafer 10 and wafer 32) as shown in FIG. 1E are then singulated into individual completed WLP detector devices.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A method for forming a coating of a material on selected portions of a substrate having a plurality of cavities formed in selected portions of a surface of the substrate, each cavity having outer, peripheral sidewalls extending outwardly from the cavity floor, comprising:
   providing a structure having a release agent thereon;
   contacting a top surface of the substrate with the release agent to transfer portions of the release agent to the top surface of the substrate while bottom portions of the cavities remain spaced from the release agent to produce an intermediate structure with a surface comprising: the release agent disposed on the top surface of the substrate and with the bottom portions of the cavities void of the release agent;
   exposing the surface of the intermediate structure to the material to blanket coat the material on both the release agent disposed on the top surface of the substrate and the bottom portions of the cavities;
   exposing the intermediate structure having the coated release agent and the bottom portions to a process to selectively remove the release agent together with the coating material thereon from the top surface of the substrate while leaving the coating material on the bottom portions of the cavities.

2. A method for forming an anti-reflection coating on selected portions of an optical energy transparent wafer having a plurality of cavities formed in selected portions of a surface of the wafer, each cavity having outer, peripheral sidewalls extending outwardly from the surface (cavity floor), comprising:
   providing a structure having a release agent thereon;
   contacting top surface of the wafer with a portion of the release agent to transfer the release agent to the top surface of the wafer while bottom portions of the cavities remain spaced from the release agent to produce an intermediate structure with a surface comprising: the release agent disposed on the top surfaces of the wafer and with the bottom portions of the cavities void of the release agent;
   exposing the surface of the intermediate structure to an anti-reflection coating material to blanket coat the anti-reflection material on both the release agent disposed on the top surface of the wafer and the bottom portions of the cavities;
   exposing the intermediate structure having both the release agent disposed on the top surface of the wafer and the bottom portions of the cavities void of the release agent to a process to selectively remove the release agent together with the anti-reflection coating material thereon while leaving the anti-reflection coating material on the bottom portions of the cavities.

3. The method recited in claim 2 including:
   providing a second wafer having a plurality of arrays for detectors, each one of the arrays being associated with a corresponding one of the cavities;
   aligning each one of the arrays with the corresponding one of the cavities;
   bonding the optically transparent wafer to the second wafer, with each one of the cavities having the anti-reflection coating thereon displaced from the corresponding array and a second portion of the top surfaces of the wafer being bonded to the second wafer.

* * * * *